US012567565B2

(12) United States Patent
Natarajan et al.

(10) Patent No.: US 12,567,565 B2
(45) Date of Patent: Mar. 3, 2026

(54) METHOD OF ISOLATING THE CHAMBER VOLUME TO PROCESS VOLUME WITH INTERNAL WAFER TRANSFER CAPABILITY

(71) Applicant: Applied Materials, Inc., Santa Clara, CA (US)

(72) Inventors: Saravanakumar Natarajan, Coimbatore (IN); Ryan Pakulski, Brentwood, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/486,616

(22) Filed: Sep. 27, 2021

(65) Prior Publication Data

US 2023/0095095 A1 Mar. 30, 2023

(51) Int. Cl.
*H01J 37/32* (2006.01)
*H01L 21/3065* (2006.01)
(Continued)

(52) U.S. Cl.
CPC .. *H01J 37/32513* (2013.01); *H01J 37/32715* (2013.01); *H01L 21/68764* (2013.01);
(Continued)

(58) Field of Classification Search
None
See application file for complete search history.

(56) References Cited

U.S. PATENT DOCUMENTS 5,571,330 A * 11/1996 Kyogoku .......... H01L 21/67098
414/217
6,221,781 B1 4/2001 Siefering et al.
(Continued)

FOREIGN PATENT DOCUMENTS

CN 101205605 B 1/2012
JP 2002141293 A 5/2002
(Continued)

OTHER PUBLICATIONS

Application No. PCT/US2022/043763, International Search Report and Written Opinion, Mailed On Jan. 2, 2023, 10 pages.
(Continued)

*Primary Examiner* — Jeffrie R Lund
*Assistant Examiner* — Tiffany Z Nuckols
(74) *Attorney, Agent, or Firm* — Kilpatrick Townsend & Stockton LLP

(57) ABSTRACT

Exemplary substrate processing systems may include a chamber body defining a transfer region. The systems may include a lid plate seated on the chamber body. The lid plate may define a plurality of apertures. The systems may include a plurality of lid stacks. The systems may include a plurality of substrate supports. The systems may include a plurality of peripheral valves. Each peripheral valve may be disposed in one of the processing regions. Each peripheral valve may include a bottom plate coupled with the chamber body. The peripheral valve may include a bellow. The bellow may be coupled with the bottom plate. The peripheral valve may include a sealing ring having a body defining a central aperture. A bottom surface of the body may be coupled with the bellow. The body may define a recess having a diameter greater than that of a support plate of a substrate support.

16 Claims, 10 Drawing Sheets

(51) Int. Cl.
  *H01L 21/311* (2006.01)
  *H01L 21/3213* (2006.01)
  *H01L 21/687* (2006.01)
(52) U.S. Cl.
  CPC ..... *H01J 2237/334* (2013.01); *H01L 21/3065* (2013.01); *H01L 21/31116* (2013.01); *H01L 21/32136* (2013.01)

(56) References Cited

U.S. PATENT DOCUMENTS

| | | | | |
|---|---|---|---|---|
| 2004/0182515 A1* | 9/2004 | Sato | .......................... | C03C 15/00 156/345.43 |
| 2004/0221808 A1* | 11/2004 | Kawano | ............... | F16J 15/0887 118/715 |
| 2008/0202423 A1* | 8/2008 | Hatanaka | ................. | C23C 16/34 118/723 VE |
| 2013/0287527 A1* | 10/2013 | Scholte Von Mast | ....................... | H01L 21/6719 414/217 |
| 2014/0150878 A1* | 6/2014 | Merry | ..................... | F16K 31/00 137/561 R |
| 2015/0126038 A1* | 5/2015 | Okita | .................. | H01L 21/6831 438/715 |
| 2016/0027672 A1* | 1/2016 | Asakawa | .......... | H01L 21/68785 156/345.37 |
| 2016/0265109 A1* | 9/2016 | Scholte Von Mast | .. | C23C 16/52 |
| 2019/0360100 A1* | 11/2019 | Nguyen | ................ | C23C 16/505 |
| 2020/0381276 A1* | 12/2020 | Yedla | ................... | B25J 15/0052 |
| 2021/0013069 A1 | 1/2021 | Kalsekar et al. | | |
| 2021/0313151 A1 | 10/2021 | Tohara et al. | | |
| 2021/0320018 A1* | 10/2021 | Chandrasekar | ..... | H01L 21/6719 |
| 2021/0335635 A1* | 10/2021 | Kalsekar | .......... | H01L 21/67017 |
| 2021/0343508 A1* | 11/2021 | Nguyen | ........... | H01J 37/32477 |

FOREIGN PATENT DOCUMENTS

| | | |
|---|---|---|
| JP | 2016505711 A | 2/2016 |
| KR | 101800719 B1 | 11/2017 |
| KR | 20210002108 A | 1/2021 |
| TW | 202135165 A | 9/2021 |

OTHER PUBLICATIONS

PCT/US2022/043763, International Preliminary Report on Patentability mailed Apr. 11, 2024, 8 pages.
TW111135668, Notice of Decision to Grant mailed Jun. 7, 2024, 2 pages.
TW111135668, Office Action mailed Jul. 7, 2023, 9 pages.
Japanese Application No. 2024-501713, Notice of Decision to Grant mailed on Aug. 12, 2025, 3 pages.
Japanese Application No. 2024-501713, Office Action mailed on Mar. 4, 2025, 3 pages.
Korean Application No. 10-2024-7001304, Notice of Decision to Grant mailed on Aug. 11, 2025, 2 pages.
Korean Application No. 10-2024-7001304, Office Action mailed on Dec. 9, 2024, 9 pages.

* cited by examiner

800

Move substrate support to a
process position          805

Move peripheral valve upward   810

Deliver a precursor          815

Generate a plasma            820

Deposit a material           825

METHOD OF ISOLATING THE CHAMBER VOLUME TO PROCESS VOLUME WITH INTERNAL WAFER TRANSFER CAPABILITY

TECHNICAL FIELD

The present technology relates to semiconductor processing equipment. More specifically, the present technology relates to semiconductor chamber components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Proper sealing of a processing volume of a chamber may be important to maintain a desirable environment for conducting processing operations. Additionally, sealing may be necessary to maintain certain regions of a processing system in a vacuum state.

Thus, there is a need for improved sealing systems and components that can be used to produce high quality semiconductor devices. These and other needs are addressed by the present technology.

SUMMARY

Exemplary substrate processing systems may include a chamber body defining a transfer region. The systems may include a lid plate seated on the chamber body. The lid plate may define a plurality of apertures through the lid plate. The systems may include a plurality of lid stacks equal to a number of apertures of the plurality of apertures defined through the lid plate. The plurality of lid stacks may at least partially define a plurality of processing regions vertically offset from the transfer region. The systems may include a plurality of substrate support assemblies equal to the number of apertures defined through the lid plate. Each substrate support assembly of the plurality of substrate support assemblies may be disposed in a respective one of the plurality of processing regions. Each substrate support assembly of the plurality of substrate support assemblies may include a support plate and a shaft that is coupled with a bottom of the support plate. The systems may include a plurality of peripheral valves equal to the number of apertures defined through the lid plate. Each peripheral valve of the plurality of peripheral valves may be disposed in a respective one of the plurality of processing regions below a respective one of the plurality of substrate support assemblies. Each peripheral valve of the plurality of peripheral valves may include a bottom plate coupled with a lower end of the chamber body. The bottom plate may be aligned with a respective one of the plurality of apertures. The peripheral valve may include a chamber sealing bellow characterized by a first surface and a second surface opposite the first surface. The first surface of the sealing bellow may be coupled with a top surface of the bottom plate. The peripheral valve may include a sealing ring having a body defining a central aperture that is sized to receive the shaft of a respective one of the plurality of substrate support assemblies. A bottom surface of the body may be coupled with a top surface of the sealing bellow. An upper surface of the body may define a recess having a diameter that is greater than a diameter of the support plate of the respective one of the plurality of substrate support assemblies. The sealing ring may be vertically translatable within the respective one of the plurality of processing regions.

In some embodiments, each peripheral valve of the plurality of peripheral valves may include an impact dampening mechanism. The impact dampening mechanism may include a spring. The sealing ring may include at least one hard stop disposed above a top surface of the sealing ring. Each peripheral valve of the plurality of peripheral valves may include a lift mechanism disposed beneath the bottom plate. Each lid stack of the plurality of lid stacks may include a choke plate seated on the lid plate along a first surface of the choke plate. The choke plate may include an inner portion that extends inward of an inner surface of the chamber body and downward alongside the inner surface of the chamber body. A top edge of the sealing ring may be vertically aligned with at least a portion of the inner portion of the choke plate. Each substrate support assembly may be vertically translatable within a respective one of the plurality of processing regions. A raised position of the substrate support assembly may be higher than a raised position of a respective one of the plurality of peripheral valves. The chamber sealing bellow may be extendable and contractible along a vertical axis of the chamber sealing bellow.

Some embodiments of the present technology may encompass substrate processing chambers. The chambers may include a chamber body that defines a processing region. The chambers may include a bottom plate coupled with a lower end of the chamber body. The bottom plate may define a central opening. The chambers may include a substrate support disposed within the chamber body. The substrate support may include a support plate comprising a heater. The substrate support may include a shaft that is coupled with a bottom of the support plate and that extends through the central opening of the bottom plate. The chambers may include a peripheral valve disposed in the processing region below the substrate support. The peripheral valve may include a chamber sealing bellow characterized by a first surface and a second surface opposite the first surface. The first surface of the sealing bellow may be coupled with a top surface of the bottom plate. The peripheral valve may include a sealing ring having a body defining a central aperture that is sized to receive the shaft of the substrate support. A bottom surface of the body may be coupled with a top surface of the sealing bellow. An upper surface of the body may define a recess having a diameter that is greater than a diameter of the support plate of the substrate support. The sealing ring may be vertically translatable within the processing region.

In some embodiments, the peripheral valve may include a plurality of atmospheric sealing bellows that are coupled with a bottom surface of the bottom plate. The sealing ring may include at least one hard stop disposed above a top surface of the sealing ring. The at least one hard stop may include a polymeric material. The chambers may include a choke plate disposed above the chamber body. The choke plate may include an inner portion that extends inward of an inner surface of the chamber body. At least a portion of the sealing ring may contact a bottom portion of the inner portion of the choke plate when the peripheral valve is in a raised position. The peripheral valve may include an impact dampening mechanism. The impact dampening mechanism may include a ball stud joint.

Some embodiments of the present technology may encompass substrate processing methods. The methods may include moving a substrate support upward within a semiconductor processing chamber from a transfer position to a process position. The methods may include moving a peripheral valve upward within the semiconductor processing chamber to seal a processing region from a remainder of a chamber volume. The methods may include flowing a precursor into the semiconductor processing chamber. The methods may include generating a plasma of the precursor within the processing region of the semiconductor processing chamber.

The methods may include etching a material on the substrate.

In some embodiments, the peripheral valve may be moved upward until a top surface of the peripheral valve contacts a lower surface of a choke plate seated atop a chamber body of the semiconductor processing chamber. The peripheral valve may be self-aligning when the top surface of the peripheral valve contacts the lower surface of the choke plate.

Such technology may provide numerous benefits over conventional systems and techniques. For example, embodiments may enable the process volume to be sealed from the chamber volume, which may enable the process volumes of adjacent chambers to be sealed from one another while a shared transfer region may be utilized. Additionally, embodiments may seal vacuum regions from one another and/or from atmospheric pressure regions during processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
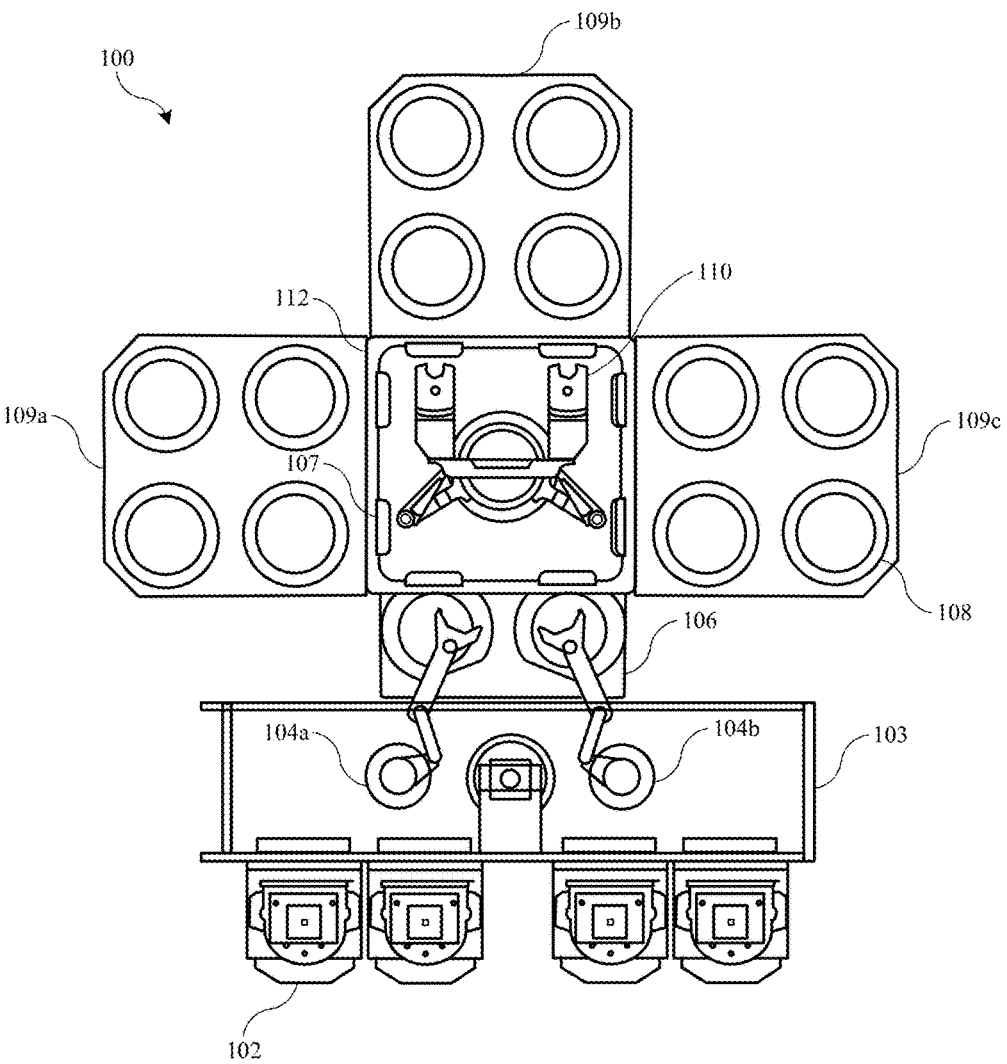
FIG. 1A shows a schematic top view of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

As additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. A substrate support may then vertically translate between the transfer region and the processing region to deliver a substrate for processing.

Based on the arrangement of processing chamber regions around the transfer section, each chamber region may share a common volume. To enable the processing regions within each chamber to be isolated from one another, embodiments may include peripheral valve mechanisms that may be raised to seal and isolate the processing regions of each chamber from one another during processing operations. The peripheral valves may be lowered to open up the transfer region of each chamber into a shared volume that enables the transfer section to transfer wafers between the chambers within the shared volume. Embodiments may also include bellows that help seal the chamber volume from atmospheric conditions when the peripheral valve is raised. Embodiments may therefore provide processing region isolation between chambers to improve processing conditions, while still facilitating transfer of wafers within a common processing volume.

Although the remaining disclosure will routinely identify specific structures, such as four-position transfer regions, for which the present structures and methods may be employed, it will be readily understood that the faceplates or components discussed may be equally employed in any number of other systems or chambers, as well as any other apparatus in which multiple components may be joined or coupled. Accordingly, the technology should not be considered to be so limited as for use with any particular chambers alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement.

In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
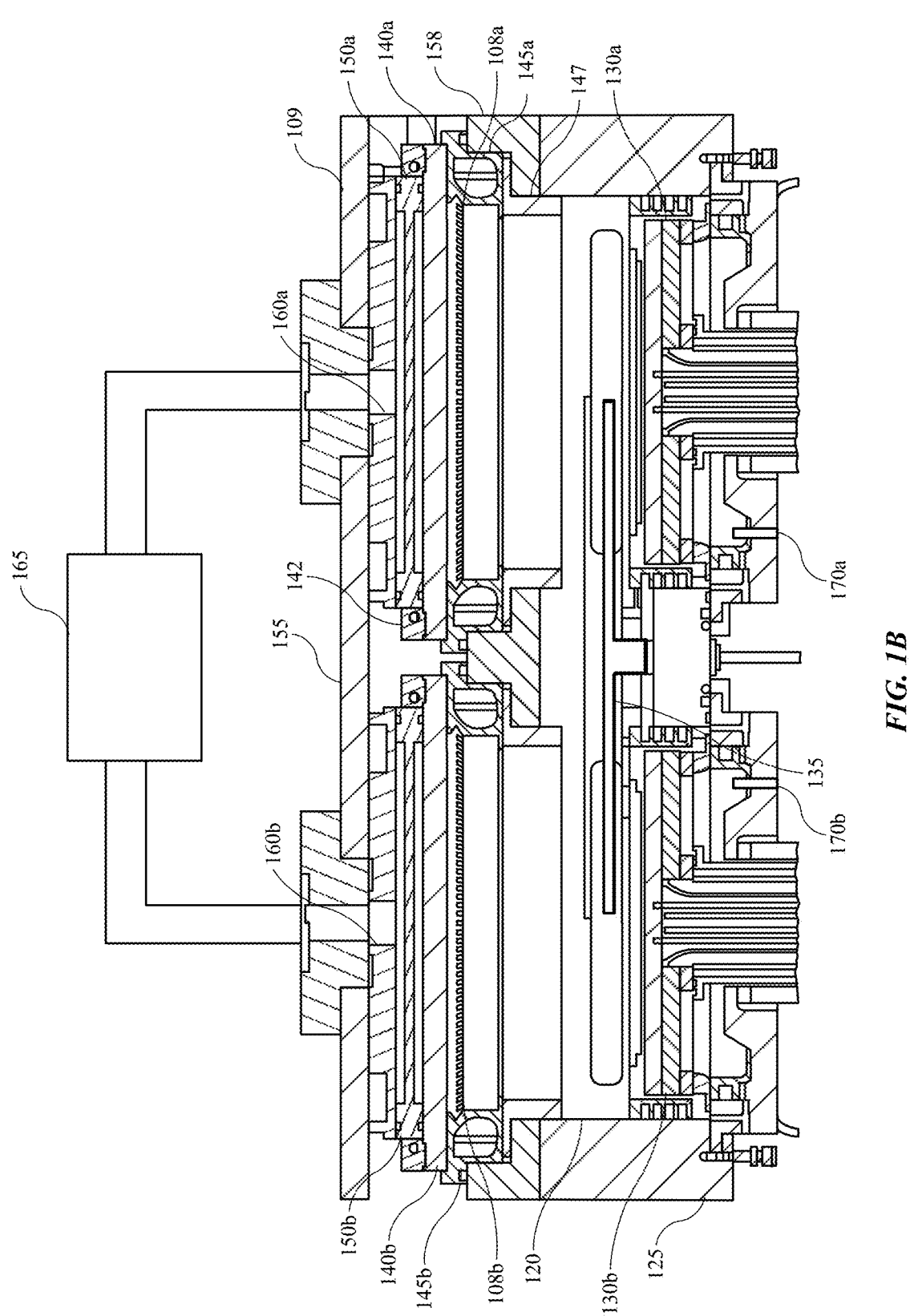
FIG. 1B shows a schematic partial cross-sectional view of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125.

The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. The faceplate may be heated in some embodiments with a heater 142 extending about the faceplate. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. The pumping liners 145 may be seated on a thermal choke plate 147, which may control heat distribution from the lid stack to the cooled chamber body. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. Lid 155 may be one of two separate lid plates of the system in some embodiments. For example, a first lid plate 158 may be seated over transfer region housing 125. The transfer region housing may define an open volume, and first lid plate 158 may include a number of apertures through the lid plate separating the overlying volume into specific processing regions. In some embodiments, such as illustrated, lid 155 may be a second lid plate, and may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

In some embodiments a purge channel 170 may extend through the transfer region housing proximate or near each substrate support 130. For example, a plurality of purge channels may extend through the transfer region housing to provide fluid access for a fluidly coupled purge gas to be delivered into the transfer region. The number of purge channels may be the same or different, including more or less, than the number of substrate supports within the processing system. For example, a purge channel 170 may extend through the transfer region housing beneath each substrate support. With the two substrate supports 130 illustrated, a first purge channel 170a may extend through the housing proximate substrate support 130a, and a second purge channel 170b may extend through the housing proximate substrate support 130b. It is to be understood that any additional substrate supports may similarly have a plumbed purge channel extending through the transfer region housing to provide a purge gas into the transfer region.

When purge gas is delivered through one or more of the purge channels, it may be similarly exhausted through pumping liners 145, which may provide all exhaust paths from the processing system. Consequently, in some embodiments both the processing precursors and the purge gases may be exhausted through the pumping liners. The purge gases may flow upwards to an associated pumping liner, for example purge gas flowed through purge channel 170b may be exhausted from the processing system from pumping liner 145b.

Figure 2:
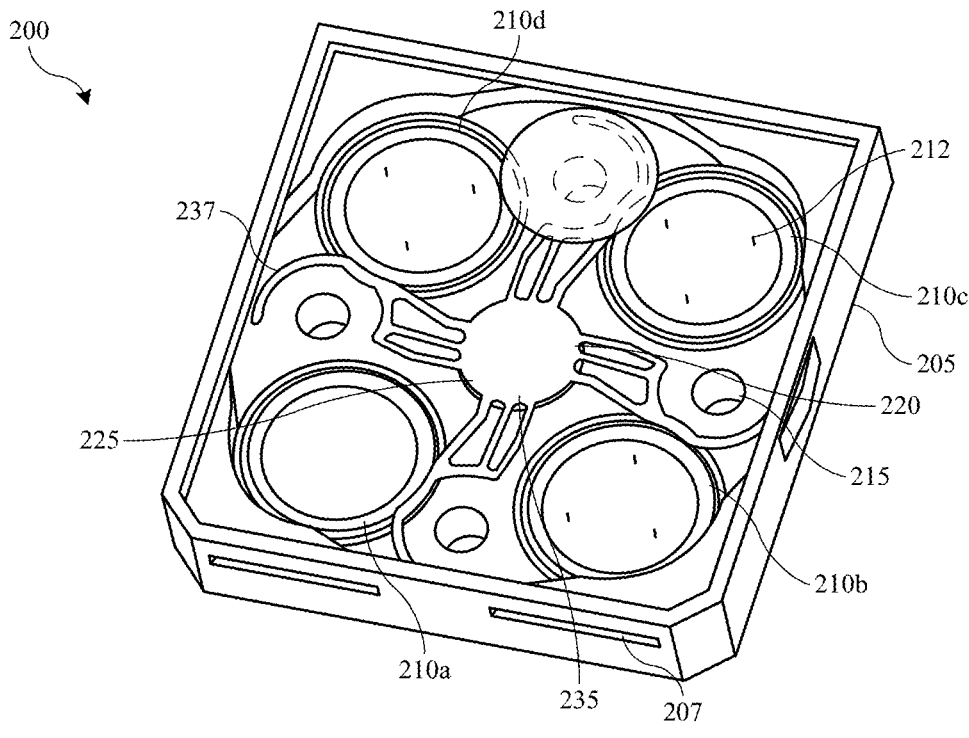
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
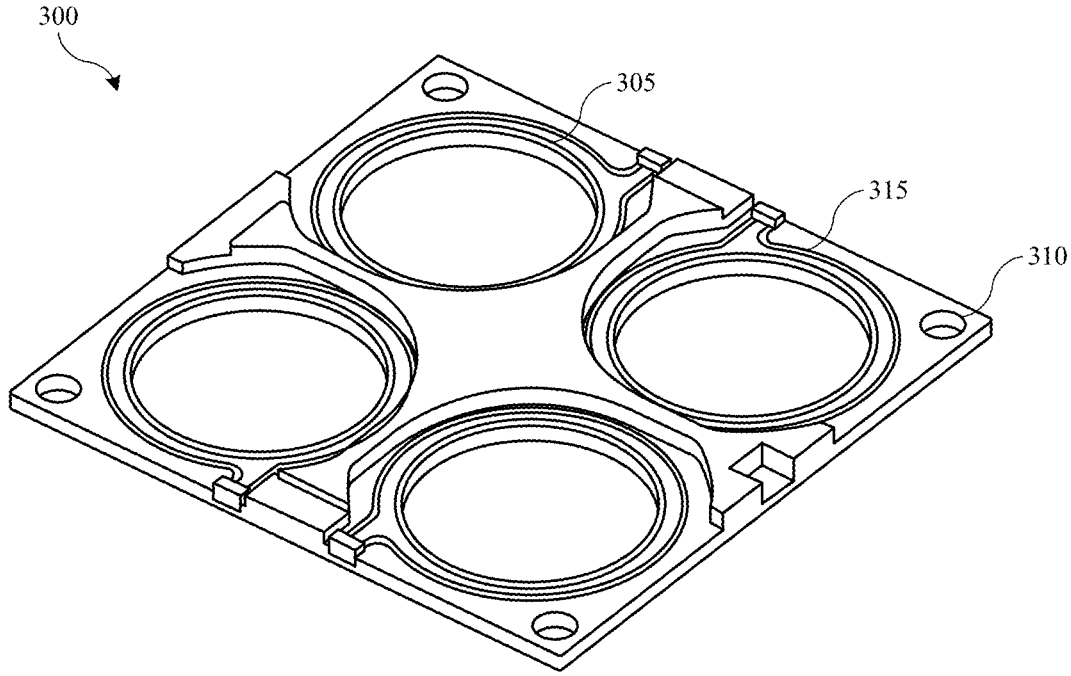
FIG. 3 shows a schematic isometric view of a lid plate of an exemplary substrate processing system according to some embodiments of the present technology.

As discussed previously, overlying the transfer region housing 205 may be a lid plate, such as a first lid plate that may define separate processing regions accessible to the substrate supports. FIG. 3 shows a schematic isometric view of a lid plate 300 of an exemplary substrate processing system according to some embodiments of the present technology. Lid plate 300 may include any feature of first lid plate 158 or any other component as previously described. As illustrated, lid plate 300 may define a first plurality of apertures 305, which may define the individual processing regions as previously described. The lid plate 300 may also define a second plurality of apertures 310. Each aperture 310 may be positioned adjacent an associated aperture 305. While apertures 305 may define processing regions, apertures 310 may define exhaust access, or access routes to a system foreline, by which each processing region may be exhausted. As will be described further below, the pumping liner for each individual lid stack may be oriented to exhaust through an associated aperture 310. Although four apertures 305 and four apertures 310 are illustrated, it is to be understood that lid plates according to embodiments of the present technology may include any number of apertures for any configuration of a processing chamber or exhaust system.

In some embodiments of the present technology a cooling system may be incorporated within the lid plate. As illustrated, a fluid cooling line 315 may be extended about each first aperture 305. This may allow cooling of the chamber body during processing. Because of the system set ups, each chamber region may exhaust to a foreline connection at a distal edge of the lid plate 300 as illustrated, although other configurations may similarly be encompassed by the present technology. Heated process gases or effluents may flow through the lid stack components and out the second apertures, which may increase a temperature of the lid plate in these regions. Consequently, a temperature profile may be developed across the lid plate, where cooler temperatures may occur near a middle of the lid plate. This may affect heat distribution from each individual lid stack as will be discussed further below. Additionally, because components of the lid stack may be coupled non-uniformly, heat loss from the components may not be uniform.

Figure 4:
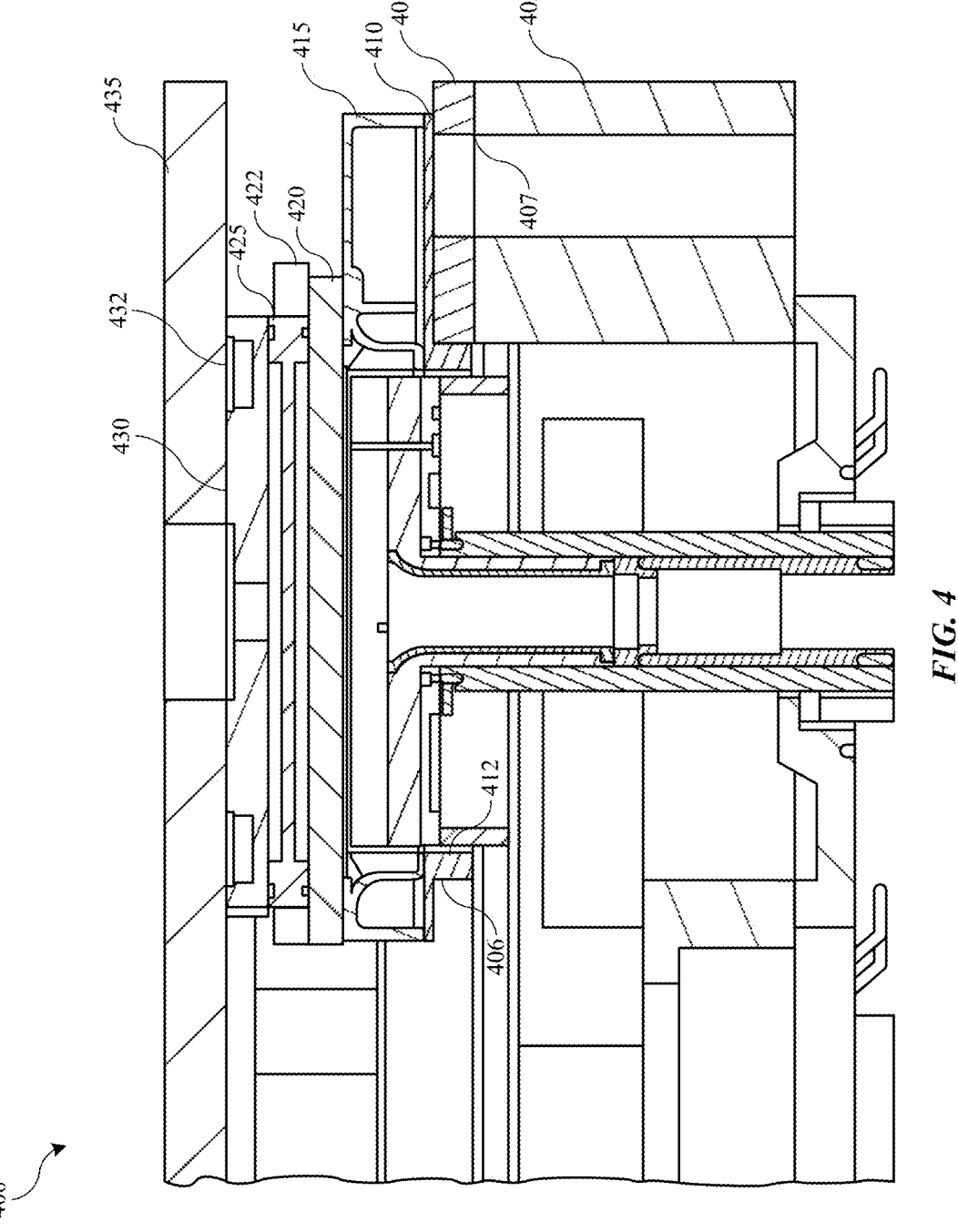
FIG. 4 shows a partial schematic cross-sectional view of an exemplary system arrangement of an exemplary substrate processing system according to some embodiments of the present technology.

FIG. 4 shows a schematic partial cross-sectional view of an exemplary processing system 400 arrangement of an exemplary substrate processing system according to some embodiments of the present technology, and may show a cross-sectional view through a first aperture and a second aperture of the lid plate as discussed above. The figure may illustrate aspects of the processing systems and components described above, and may illustrate additional aspects of the system. The figure may illustrate an additional view or version of the system. It is to be understood that processing system 400 may include any aspect of any portion of the processing systems described or illustrated elsewhere, and may illustrate aspects of a lid stack incorporated with any of the systems described elsewhere. For example, processing system 400 may illustrate a portion of a system overlying the transfer region of a chamber, and may show components positioned over a chamber body defining a transfer region as previously described. It is to be understood that any previously noted components may still be incorporated, such as including a transfer region and any component described previously for a system including the components of processing system 400.

As noted previously, multi-chamber systems may include individual lid stacks for each processing region. Processing system 400 may illustrate a view of one lid stack that may be part of a multi-chamber system including two, three, four, five, six, or more processing chamber sections. It is to be understood, however, that the described lid stack components may also be incorporated in standalone chambers as well. As described above, one or more lid plates may contain the individual lid stacks for each processing region. For example, as illustrated, processing system 400 may include a first lid plate 405, which may be or include any aspect of lid plate 158 described above. For example, first lid plate 405 may be a single lid plate that may be seated on the transfer region housing 402, or chamber body as previously described. The first lid plate 405 may be seated on the housing along a first surface of the lid plate. Lid plate 405 may define a first plurality of apertures 406 through the lid plate allowing the vertical translation of substrates into the defined processing regions as previously described. Apertures 406 may define processing regions where substrate processing may be performed. Lid plate 405 may additionally define a second plurality of apertures 407 through the lid plate allowing exhaust to a foreline and pumping system associated with the processing system.

Seated on the first lid plate 405 may be a plurality of lid stacks as previously described. In some embodiments, the first lid plate 405 may define a recessed ledge as previously illustrated extending from a second surface of the first lid plate 405 opposite the first surface. The recessed ledge may extend about each aperture 406 of the first plurality of apertures, or may extend about a portion of the aperture as illustrated above. Each individual lid stack may be seated on a separate recessed ledge, or may be seated over non-recessed apertures. The plurality of lid stacks may include a number of lid stacks equal to a number of apertures of the plurality of apertures defined through the first lid plate. The lid stacks may at least partially define a plurality of processing regions vertically offset from the transfer region as described above. Although one aperture 406 and one lid stack are illustrated and will be discussed further below, it is to be understood that the processing system 400 may include any number of lid stacks having similar or previously discussed components incorporated with the system in embodiments encompassed by the present technology. The following description may apply to any number of lid stacks or system components.

The lid stacks may include any number of components in embodiments, and may include any of the components described above. For example, the lid stacks may include a choke plate 410 seated on the second surface of the lid plate 405. The choke plate 410 may be seated on the lid plate on a first surface of the choke plate 410. The choke plate may define a first aperture axially aligned with the associated aperture 406 of the first plurality of apertures through the lid plate. The choke plate may also define a second aperture axially aligned with the associated aperture 407 of the second plurality of apertures through the lid plate. As illustrated, choke plate 410 may include a rim 412 defining the first aperture through the choke plate. The rim 412 may extend along a sidewall of the lid plate defining the associated first aperture 406 of the first plurality of apertures. As will be explained below, in some embodiments a gap may be maintained between the rim and the lid plate to control heat flow between the components. Rim 412 may extend vertically from the first surface of the choke plate in a direction towards the lid plate 405, and may form a protrusion from the choke plate 410.

A pumping liner 415 may be seated on a second surface of the choke plate 410 opposite the first surface of the choke plate seated on the lid plate 405. As noted above, pumping liner 415 may be arranged to provide an exhaust to the processing volume, which may flow to the associated second aperture 407. Accordingly, aperture 407 of the second plurality of apertures defined through the lid plate, and the second aperture defined through the choke plate 410 may form a flow channel extending from the pumping liner for the specific processing region defined by the particular lid stack, and which may fluidly couple the processing region with a pumping system or exhaust system. The lid stack may include a faceplate 420 seated on the pumping liner 415. In some embodiments, faceplate 420 may be a heated component, which may include a heater 422, which may be an annular heater in some embodiments, extending about the faceplate.

A blocker plate 425 may be seated on the faceplate 420, and may further facilitate uniform distribution of precursors as described above. In some embodiments, faceplate heater 422 may extend about an outer edge of blocker plate 425, such as radially outward of the blocker plate, and may extend radially about the blocker plate 425. A gap may be maintained between the blocker plate and the heater 422 to limit heating of the blocker plate. A gasbox 430 may be seated on the blocker plate 425. Gasbox 430 may define a channel 432 in which a cooling fluid may be flowed to control a temperature of the components. A second lid plate 435 may be seated on the gasbox 430.

Accordingly, cooling may be provided both above the faceplate with the gasbox, and below the faceplate with the lid plate. While cooling from the gasbox may be maintained relatively uniform based on coupling with the stacked arrangement with the blocker plate, which may provide axi-symmetric cooling from above, cooling to the lid plate may be more difficult to maintain based on the asymmetric coupling of the underlying components. For example, pumping liner 415 may have direct heating from the faceplate seated on the liner, and thus pumping liner 415 may be heated relatively uniformly from the faceplate. However, heat distribution from the pumping liner may not be uniform. As shown in the illustration, choke plate 410 may provide coupling between the pumping liner and lid plate 405, which may include cooling. Although a temperature gradient may be formed across the lid plate with a higher temperature about the second aperture 407, the choke plate 410 and pumping liner 415 may have increased direct coupling with the lid plate at this location, facilitating heat transfer from the pumping liner.

Figure 5:
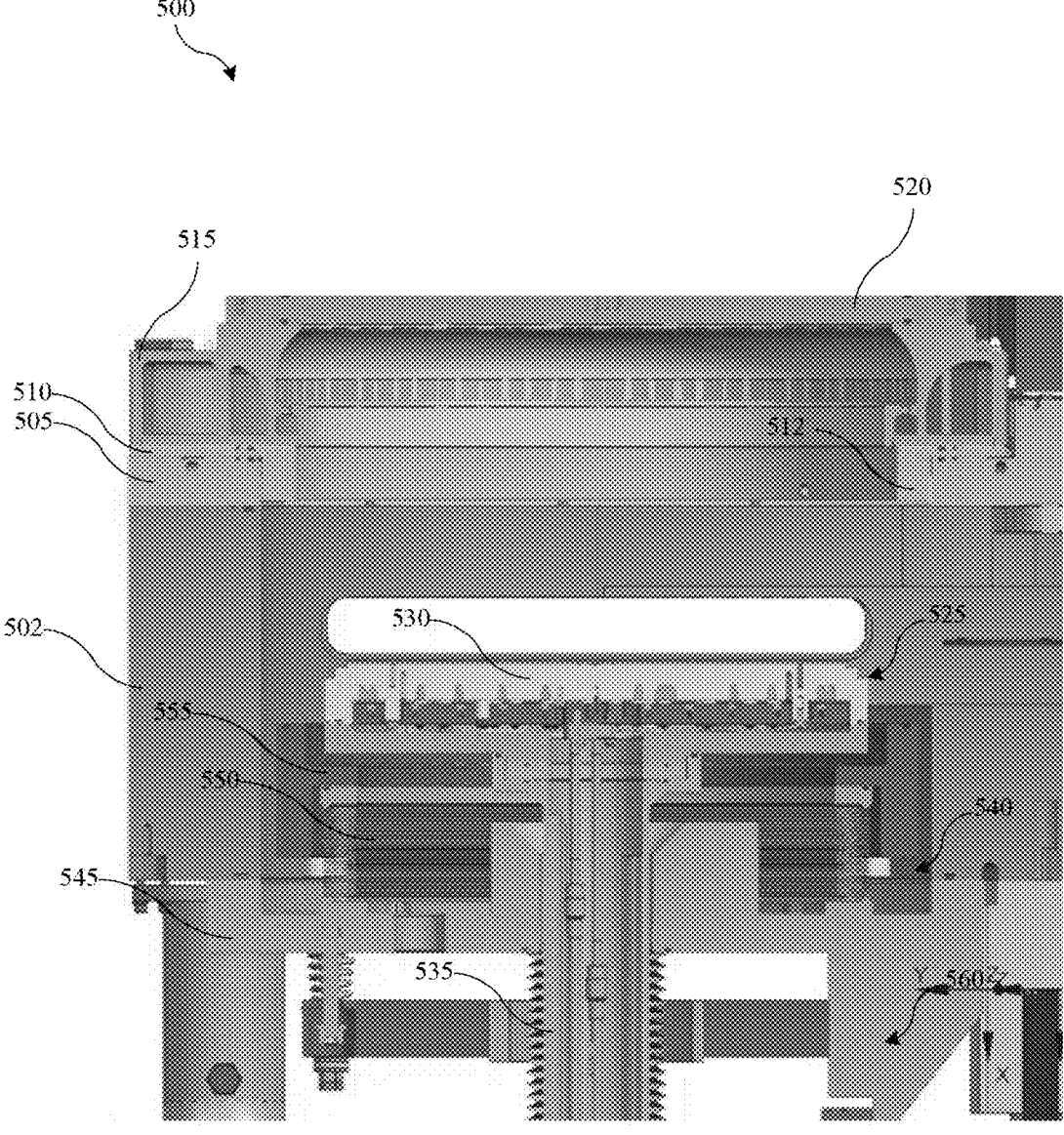
FIG. 5 shows a schematic side elevation cross-sectional view of an exemplary substrate processing system according to some embodiments of the present technology.

FIG. 5 shows a schematic cross-sectional side elevation views of an exemplary processing chamber 500 according to some embodiments of the present technology. FIG. 5 may illustrate further details relating to components in systems 100, 200, and/or 400. Chamber 500 is understood to include any feature or aspect of systems 100, 200, and/or 400 discussed previously in some embodiments. The chamber 500 may be used to perform semiconductor processing operations, such as deposition, removal, etching, and cleaning operations. Chamber 500 may show a partial view of the chamber components being discussed and that may be incorporated in a semiconductor processing system. Any aspect of chamber 500 may also be incorporated with other processing chambers or systems as will be readily understood by the skilled artisan.

Chamber 500 may include a chamber body 502 that may define a transfer region and a processing region. A lid plate 505 may be seated atop the chamber body 502 and may support a choke plate 510. The choke plate may define an aperture that is axially aligned with an associated aperture of lid plate 505. As illustrated, choke plate 510 may include a rim 512 defining the aperture through the choke plate 510. The rim 512 may extend along an inner sidewall of the lid plate 505 such that the rim 512 extends into the aperture defined by the lid plate 505, with at least a portion of the rim 512 extending below all or a portion of the lid plate 505. A liner 515, such as a pumping liner, may be seated atop an upper surface of choke plate 510 in some embodiments. A faceplate 520 may be disposed atop the liner 515. In some embodiments, one or more intervening components may be disposed between the faceplate 520 and the liner 515.

A substrate support 525 may be disposed within the interior of the chamber body 502. The substrate support 525 may be vertically translatable within the chamber body 502 between the transfer region and the processing region. The substrate support 525 may include a support plate 530, which may include a heater in some embodiments. The substrate support 525 may also include a shaft 535 that may extend through a bottom of the chamber body 502 and couple with a radio frequency source and/or other power source.

Chamber 500 may include a peripheral valve 540, which may selectively seal the process region from a common chamber volume during processing operations. Peripheral valve 540 may be disposed in the transfer region of chamber 500 and may be positioned outward and/or below the substrate support 525. The peripheral valve 540 may include a bottom plate 545 that may be coupled with a lower end of the chamber body 502. For example, in some embodiments, a top surface of the peripheral edge of the bottom plate 545 may be positioned against and coupled with a bottom surface of the chamber body 502. The bottom plate 545 may be generally aligned with an aperture of the lid plate 505. The bottom plate 545 may define a central aperture that may receive the shaft 535 of the substrate support 525. Peripheral valve 540 may include a chamber sealing bellow 550 that may be characterized by a first surface and a second surface, which may be opposite the first surface. The chamber sealing bellow 550 may be extendable and contractible along a length of the chamber sealing bellow 550 such that a distance between the first surface and the second surface may vary during movement of the peripheral valve 540. The bottom surface of the chamber sealing bellow 550 may be coupled with a top surface of the bottom plate 545 in some embodiments. Peripheral valve 540 may include a sealing ring 555 that includes a body that defines a central aperture that is sized to receive the shaft 535 of the substrate support 525. The body of the sealing ring 555 may be characterized by a first surface (such as a bottom surface) and a second surface (such as a top surface), with the first surface being coupled with a top surface of the chamber sealing bellow 550 such that vertical translation of the sealing ring 555 within the chamber body 502 may cause the chamber sealing bellow 550 to extend and/or contract. The second surface of the body of the sealing ring 555 may define a recess that has a diameter that is greater than a diameter of the support plate 530 of the substrate support 525, which enables a portion of the support plate 530 to be received within the recess when the substrate support 525 and peripheral valve 540 are in a lowered position. As will be discussed in greater detail below, the peripheral valve 540 may translate upward within the chamber body 502 to a raised position in which an upper surface of the sealing ring 555 (and/or a hard stop coupled thereto) may contact a lower surface of rim 512 of the choke plate 510 which may be in vertical alignment with the upper surface of the sealing ring 555. The upper surface of the sealing ring 555 may include a compressible sealing element, such as an O-ring or gasket, which may be compressed against the lower surface of the rim 512 to seal the processing region from the rest of the chamber volume. This may be particularly beneficial in embodiments where multiple chambers share a common chamber volume, as the raised peripheral valve 540 may enable each chamber to have a dedicated processing region that is isolated from other processing regions during processing operations. The isolation of processing regions may improve operating conditions within each chamber and may result in improved wafer quality. Peripheral valve 540 may include a lift mechanism 560 that may be disposed beneath the bottom plate 545. A portion of the lift mechanism 560 may extend through the bottom plate 545 and may couple with a bottom surface of the sealing ring 555 and may extend and contract to translate the sealing ring 555 within the chamber body 502.

Figure 6A:
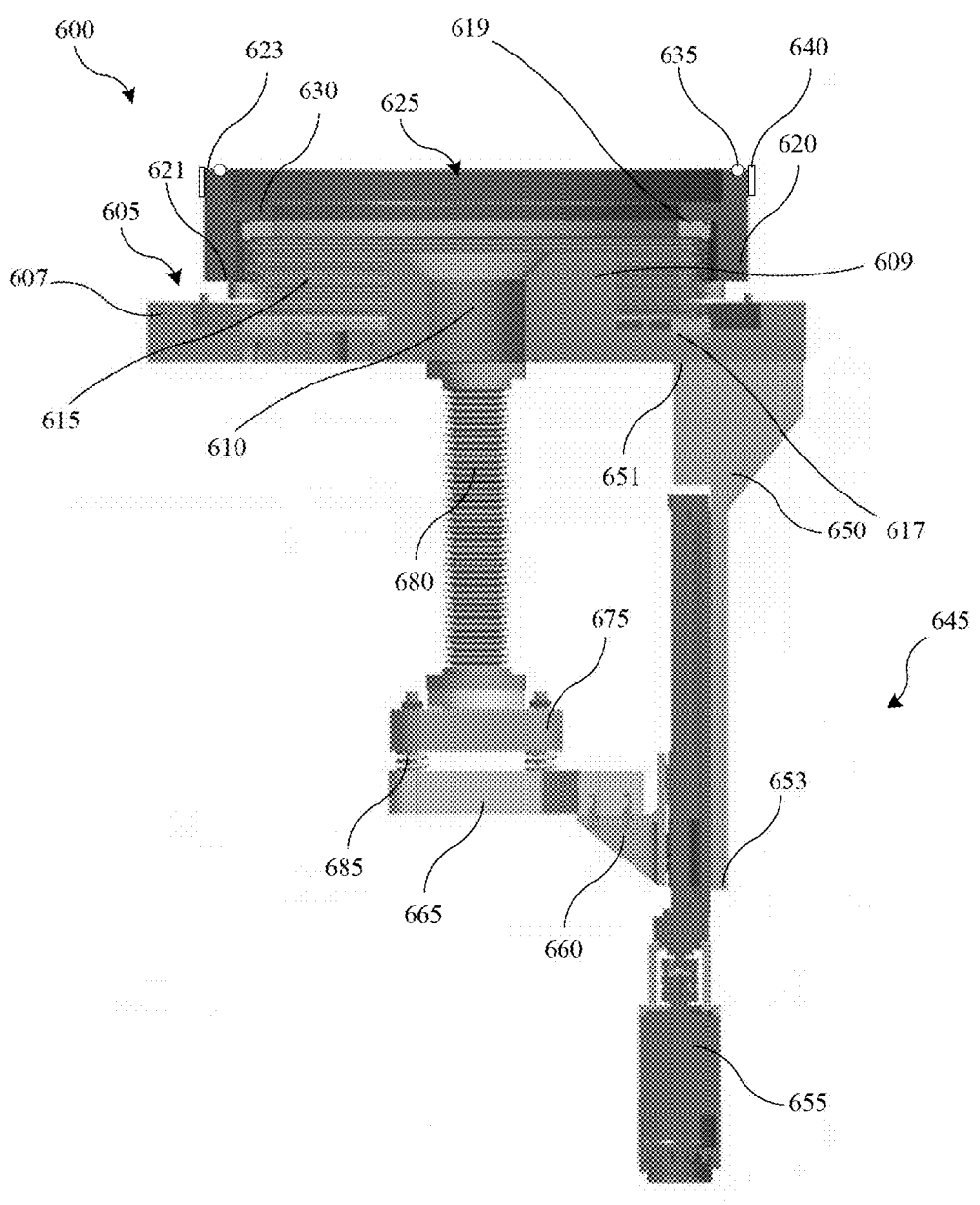
FIGS. 6A-6C show schematic side elevation cross-sectional views of a peripheral valve of an exemplary substrate processing system according to some embodiments of the present technology.
Figure 6B:
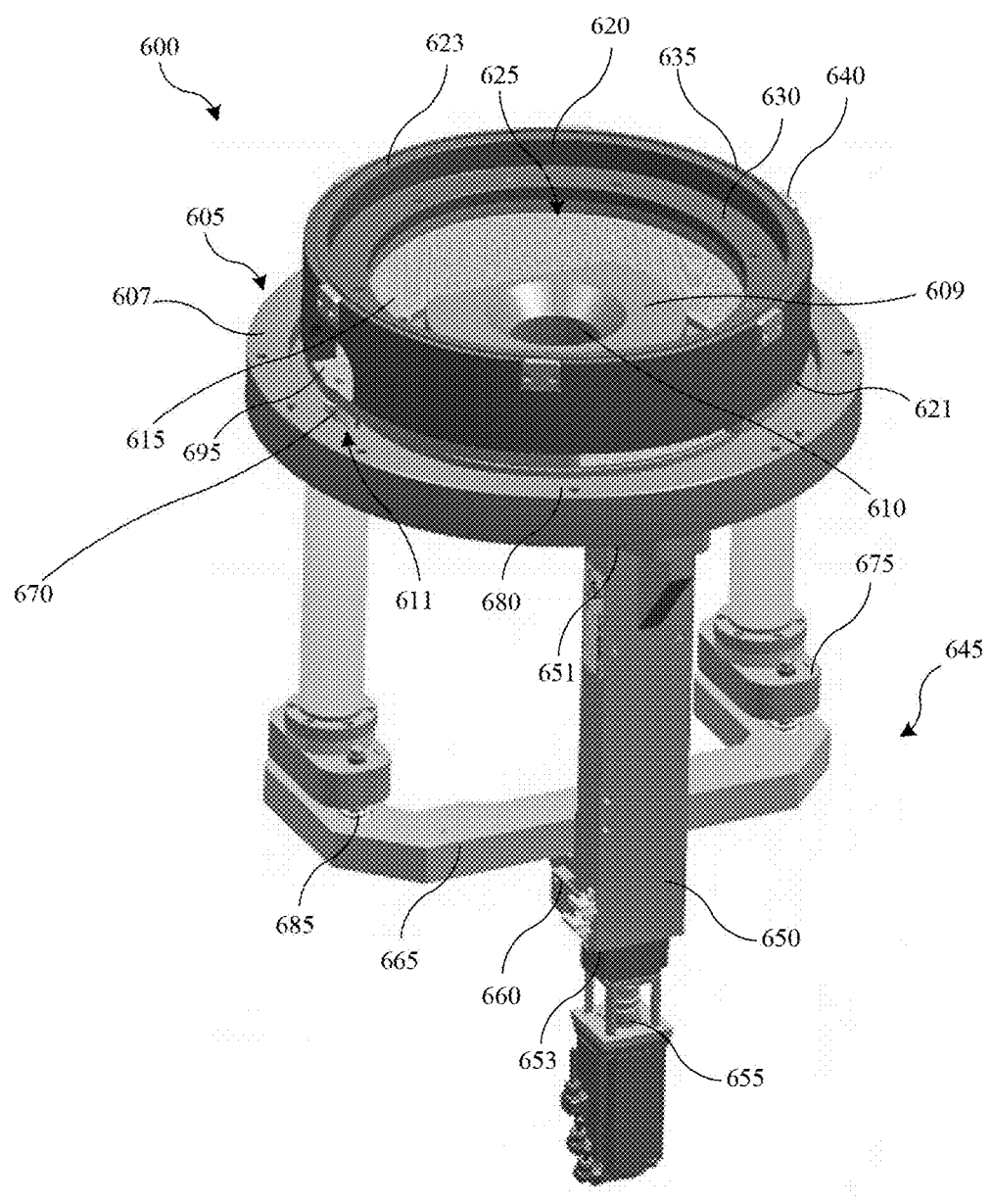

FIGS. 6A and 6B show a schematic side elevation view of an exemplary peripheral valve 600 according to some embodiments of the present technology. Peripheral valve 600 may illustrate additional features of peripheral valve 540 previously described, and may include any feature or characteristic as discussed above. Additionally, peripheral valve 600 may be disposed within a processing system and/or chamber as previously described, such as systems 100, 200, and 400, and/or chamber and 500. Peripheral valve 600 may include a bottom plate 605 (which may be similar to bottom plate 545) that may be coupled with a lower end of a chamber body (such as chamber body 502). For example, in some embodiments, a top surface of the peripheral edge of the bottom plate 605 may be positioned against and coupled with a bottom surface of the chamber body. The bottom plate 605 may include an outer rim 607 that projects upward from a main body of the bottom plate 605 proximate a peripheral edge of the bottom plate 605. The outer rim 607 may provide increased material that may provide greater support for the coupling between the bottom plate 605 and the chamber body. The bottom plate 605 may include an inner region 609 that protrudes upward from the main body proximate a center of the bottom plate 605. In some embodiments, the inner region 609 may protrude upward to a greater height than a top surface of the outer rim 607. The bottom plate 605 may define a central aperture 610 that may receive the shaft of a substrate support (such as substrate support 525). In some embodiments, the central aperture 610 may have a tapered top portion with a generally cylindrical lower portion. The tapered upper portion may better accommodate a bottom end of the substrate support when the substrate support is in a lowered position. The bottom plate 605 may define a number of additional apertures within a main body of the bottom plate 605. For example, as best illustrated in FIG. 6B, the bottom plate 605 may define apertures 611 at two opposing sides of the bottom plate 605 radially inward of the outer rim 607 and radially outward of the inner region 609. Bottom plate 605 may define other numbers of apertures 611. For example, bottom plate 605 may define at least or about two apertures 611, at least or about three apertures 611, at least or about four apertures 611, at least or about five apertures 611, or more. Oftentimes the apertures 611 may be spaced at equal angular intervals about the bottom plate 605 although some embodiments may provide irregular spacing between two or more of the apertures 611.

Peripheral valve 600 may include a chamber sealing bellow 615 (similar to chamber sealing bellow 550) that may be characterized by a first surface 617 and a second surface 619, which may be opposite the first surface 617. The chamber sealing bellow 615 may be extendable and contractible along a length of the chamber sealing bellow 615 such that a distance between the first surface 617 and the second surface 619 may vary during movement of the peripheral valve 600. The first surface 617 may be coupled with a top surface of the bottom plate 605 in some embodiments. For example, the first surface 617 may be fastened and/or otherwise secured to the bottom plate 605 at a position that is radially inward of apertures 611 such that the first surface 617 is fixed against the bottom plate 605.

Peripheral valve 600 may include a sealing ring 620 (which may be similar to sealing ring 555). Sealing ring 620 may include a generally annular body that defines a central aperture 625 that may receive the shaft of the substrate support. The body of the sealing ring 620 may be characterized by a first surface 621 and a second surface 623. The body of the sealing ring 620 may be coupled with second surface 619 of the chamber sealing bellow 615 such that vertical translation of the sealing ring 620 within the chamber body may cause the chamber sealing bellow 615 to extend and/or contract. For example, the body of the sealing ring 620 may include an inner protrusion 630 that extends from an inner surface of the body a distance into the central aperture 625. In some embodiments, the inner protrusion 630 may be annular in shape and may extend about an entirety of the inner surface of the body, while in other embodiments the inner protrusion 630 may extend from only a portion of the inner surface of the body of the sealing ring 620. The second surface 619 of the chamber sealing bellow 615 may be fastened and/or otherwise coupled with a lower surface of the inner protrusion 630. The lower surface of the inner protrusion and the inner wall of the annular body of the sealing ring 620 may define a lower recess within the sealing ring 620. The lower recess may receive a portion of the chamber sealing bellow 615, which may seal a volume extending between an underside of the sealing ring 620 and the bottom plate 605.

The second surface 623 of the body of the sealing ring 620 may define an upper recess that has a diameter that is greater than a diameter of the support plate of the substrate support, which enables a portion of the support plate to be received within the recess when the substrate support and peripheral valve 600 are in a lowered position. For example, the inner wall of the body of the sealing ring 620 and an upper surface of inner protrusion 630 may define the upper recess. Second surface 623 may include a compressible sealing element 635 (such as an 0-ring or gasket), which may be compressed between the second surface 623 and a lower surface of a choke plate of the chamber when the peripheral valve 600 is in a raised position. The sealing element 635 may be seated within a channel formed within the second surface 623 and may project slightly above the second surface 623. In some embodiments, one or more hard stops 640 may be coupled with the sealing ring 620. The hard stops 640 may be formed of a polymeric material, such as polyetheretherketone (PEEK) and/or other thermoplastic and/or chemically resistant polymer material. For example, a number of hard stops 640 may be coupled with an outer surface of the sealing ring 620 at regular and/or irregular angular intervals. A top surface of each of the hard stops 640 may extend a small distance above the second surface 623, such that when raised, the hard stops 640 contact the underside of the rim of the choke plate to prevent the sealing ring 620 from first contacting (or ever contacting) the rim of the choke plate. For example, each hard stop 640 may extend above second surface 623 of the sealing ring 620 by between or about 5 mils and 100 mils, between or about 10 mils and 75 mils, between or about 15 mils and 50 mils, or between or about 20 mils and 30 mils. A thickness of the sealing element 635 may be greater than the distance between the top of each hard stop 640 and second surface 623 such that when the hard stops 640 engage with the lower surface of the choke plate, the sealing element 635 is compressed between the lower surface of the choke plate and second surface 623 to seal the process volume from the rest of the chamber volume (and slit valve). The softer polymeric material of the hard stops 640 may dampen the impact between the peripheral valve 600 and choke plate when the peripheral valve is raised. Any number of hard stops 640 may be used. For example, the peripheral valve 600 may include at least or about two hard stops, at least or about three hard stops, at least or about four hard stops, at least or about five hard stops, at least or about six hard stops, at least or about seven hard stops, at least or about eight hard stops, at least or about nine hard stops, at least or about ten hard stops, or more.

Peripheral valve 600 may include a lift mechanism 645, which may operate to translate the sealing ring 620 and second surface 619 of the chamber sealing bellow 615 within the processing chamber. Lift mechanism 645 may include a mounting bracket 650 that couples the lift mechanism 645 with the bottom plate 605. For example, a top surface 651 of the mounting bracket 650 may be fastened against and/or otherwise coupled with a lower surface of the bottom plate 605. A lower portion of the mounting bracket 650 may be coupled with an actuator 655, such as a servo motor and/or other linear actuator, that may raise and lower a platform 660 that is movably mounted on the mounting bracket 650. A mounting support 665 may be coupled with the platform 660 such that vertical movement of the platform 660 may cause a corresponding vertical movement of the mounting support 665. The mounting support 665 may define an open interior that enables a shaft of a substrate support to extend through the mounting support 665. As illustrated, the mounting support 665 is provided as a C-shaped body, with a medial portion of the C-shape being coupled with the platform 660, although other designs with open centers may be utilized in various embodiments. Lift rods 670, such as swivel lifts, may be supported atop ends of the mounting support 665. As shown here, two lift rods 670 may be provided, however other numbers of lift rods 670 are possible in various embodiments. Oftentimes, a number of lift rods 670 matches the number of apertures 611 formed in the bottom plate 605. A bottom end of each lift rod 670 may be coupled with a top surface of the mounting support 665, such as via a base 675 that is mounted atop the mounting support 665. A top end of each lift rod 670 may extend through the bottom plate 605, such as through one of the apertures 611. The top end of the lift rod 670 may be directly and/or indirectly coupled with the sealing ring 620. For example, in some embodiments the top end may be fastened directly to first surface 621 of the sealing ring 620. In other embodiments, such as illustrated here, one or more sealing ring supports 695 may be used to couple the top end of each lift rod 670 to the first surface 621 of the sealing ring 620. When the actuator 655 raises the platform 660, the mounting support 665 may lift the lift rods 670 such that the top ends of the lift rods 670 extend upward through apertures 611 and elevate the sealing ring 620 relative to the bottom plate 605. In some embodiments, each lift rod 670 may include an atmospheric sealing bellow 680. For example, the atmospheric sealing bellow 680 may surround the lift rod 670, with a top end of the atmospheric sealing bellow 680 being coupled with a lower surface of bottom plate 605 and a lower end of the atmospheric sealing bellow 680 being coupled with a top surface of base 675. In such a manner, the chamber may be sealed from the region of the structure that contains the lift mechanism 645.

Figure 6C:
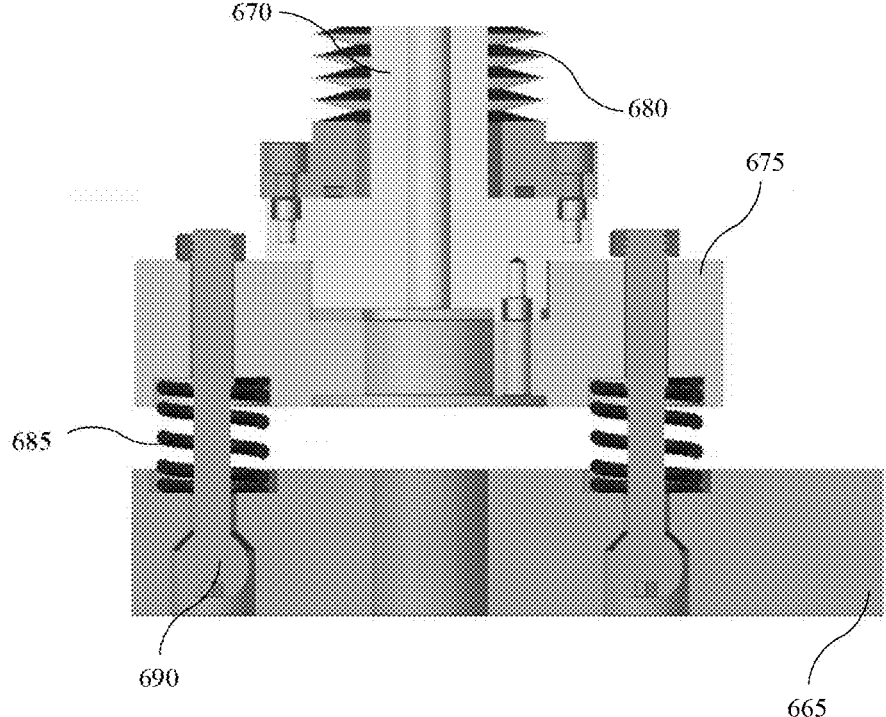

In some embodiments, the base 675 may include an impact dampening and/or a self-aligning mechanism, which may be the same component or different components. FIG. 6C illustrates a partial schematic cross-sectional side elevation view of base 675. For example, the base 675 may be fastened to the mounting support 665 with one or more impact dampening mechanisms positioned between the components. As illustrated, the impact dampening mechanism may include one or more springs 685 that are disposed between a bottom surface of the base 675 and a top surface of the mounting support 665. When the second surface 623 and/or hard stops 640 contact the choke plate during the elevation of the peripheral valve 600, the springs 685 help dampen the force of the impact and help protect the actuator 655. In some embodiments, the spring force may serve as a force limiter that triggers the actuator 655 to stop raising the peripheral valve 600.

Additionally, the springs 685 may help self-align the peripheral valve 600 in the event that the contact surfaces of the choke plate and sealing ring 620 are not perfectly parallel to one another. For example, any misalignment of the contact surfaces of the choke plate and sealing ring 620 may result in the springs 685 on one base 675 and/or on one side of one or more bases 675 being compressed to different heights than other springs 685, which may enable the second surface 623 of the sealing ring 620 to deflect and/or tilt relative to a default position such that the contact surfaces of the choke plate and sealing ring 620 may be parallel to enable the peripheral valve 600 to properly seal the process volume from the rest of the chamber volume. To further enable the deflection and/or tilting of the sealing ring 620, the base 675 may include one or more ball studs 690 that enable the base 675 to rotate and/or otherwise vertically and/or horizontally translate relative to the mounting support 665 to accommodate any misalignment of the contact surfaces of the choke plate and sealing ring 620. For example, a ball portion of the ball studs 690 may be received within a socket formed in the mounting support 665 and may include a fastening portion that extends through a center of the springs 685 and through the base 675. A fastener, such as a nut, may secure the fastening portion of the ball stud 690 with the base 675. In some embodiments, the springs 685 may have a total stroke of between about 100 mils and 500 mils to accommodate any misalignment of the choke plate and sealing ring 620, although the amount of stroke may be dependent on the spring force, design of the peripheral valve 600, and/or chamber tolerances.

When raised, the peripheral valve 600 may seal the processing region from the rest of the chamber volume. This may be particularly beneficial in embodiments where multiple chambers share a common chamber volume, as the raised peripheral valve 600 may enable each chamber to have a dedicated processing region that is isolated from other processing regions during processing operations. The isolation of processing regions may improve operating conditions within each chamber and may result in improved wafer quality. Additionally, the atmospheric sealing bellows

680 may help seal the chamber region (which may be maintained in a vacuum state) from the exterior of the chamber (such as the area housing the lift mechanism 645) to maintain the vacuum environment within the chamber.

Figures 7A, 7B, 7C:
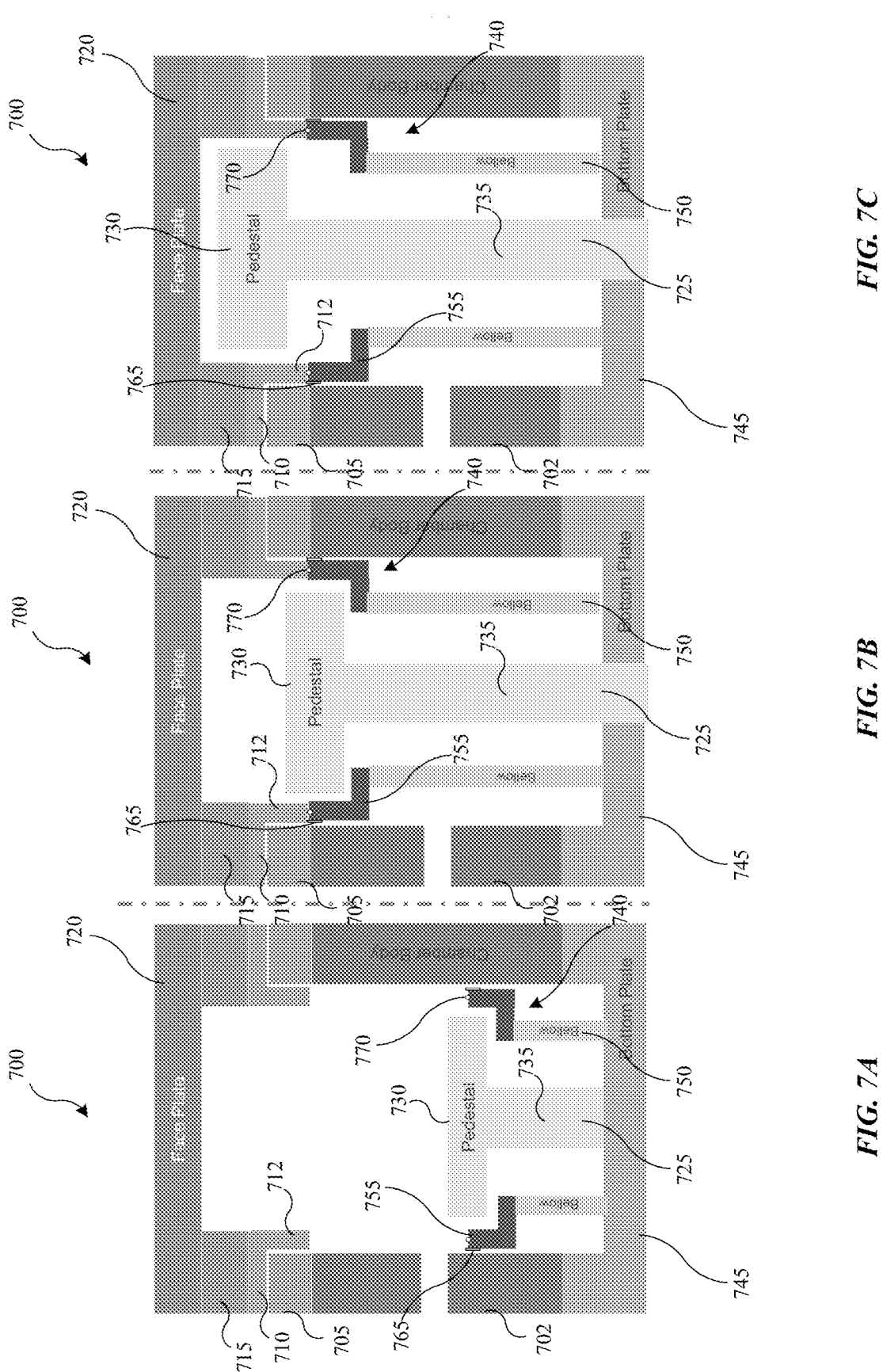
FIGS. 7A-7C show schematic partial cross-sectional views of an exemplary chamber system according to some embodiments of the present technology.

FIGS. 7A-7C illustrate a simplified schematic side elevation cross-sectional view of an exemplary chamber 700 according to embodiments of the present technology. FIGS. 7A-7C may illustrate further details relating to components in systems 100, 200, and 400, and/or chamber 500. Chamber 700 is understood to include any feature or aspect of systems 100, 200, and 400, and/or chamber 500 discussed previously in some embodiments. The chamber 700 may be used to perform semiconductor processing operations, such as deposition, removal, and cleaning operations. Chamber 700 may show a partial view of the chamber components being discussed and that may be incorporated in a semiconductor processing system. Any aspect of chamber 700 may also be incorporated with other processing chambers or systems as will be readily understood by the skilled artisan.

Chamber 700 may include a chamber body 702 that may define a transfer region and a processing region. A lid plate 705 may be seated atop the chamber body 702 and may support a choke plate 710. As illustrated, choke plate 710 may include a rim 712 defining an aperture through the choke plate 710. The rim 712 may extend along an inner sidewall of the lid plate 705 such that the rim 712 extends into the aperture defined by the lid plate 705, with at least a portion of the rim 712 extending below all or a portion of the lid plate 705. A liner 715, such as a pumping liner, may be seated atop an upper surface of choke plate 710 in some embodiments. A faceplate 720 may be disposed atop the liner 715. In some embodiments, one or more intervening components may be disposed between the faceplate 720 and the liner 715.

A substrate support 725 may be disposed within the interior of the chamber body 702. The substrate support 725 may be vertically translatable within the chamber body 702 between the transfer region and the processing region. The substrate support 725 may include a support plate 730, which may include a heater in some embodiments. The substrate support 725 may also include a shaft 735 that may extend through a bottom of the chamber body 702 and couple with a radio frequency source and/or other power source. A peripheral valve 740 may be disposed in the transfer region of chamber 700 and may be positioned outward and/or below the substrate support 725. Peripheral valve 740 may be similar to peripheral valves 540 and 600 described herein and may be understood to have any feature described in relation to such peripheral valves. For example, the peripheral valve 740 may include a bottom plate 745 that may be coupled with a lower end of the chamber body 702. The bottom plate 745 may define a central aperture that may receive the shaft 735 of the substrate support 725. Peripheral valve 740 may include a chamber sealing bellow 750 that may be characterized by a first surface and a second surface, which may be opposite the first surface. The bottom surface of the chamber sealing bellow 750 may be coupled with a top surface of the bottom plate 745 in some embodiments. Peripheral valve 740 may include a sealing ring 755 that includes a body that defines a central aperture that is sized to receive the shaft 735 of the substrate support 725. A top surface of the body of the sealing ring 755 may define a recess that has a diameter that is greater than a diameter of the support plate 730 of the substrate support 725, which enables a portion of the support plate 730 to be received within the recess when the substrate support 725 and peripheral valve 740 are in a lowered position as shown in FIG. 7A.

The substrate support 725 and peripheral valve 740 may be raised from the position shown in FIG. 7A to a raised, process position as shown in FIG. 7C. For example, a lift mechanism of the substrate support 725 may raise the substrate support 725 to the raised position, while a lift mechanism (similar to lift mechanism 645) of the peripheral valve 740 may raise the peripheral valve 740 to a raised position. The raising of the substrate support 725 and peripheral valve 740 may be sequential and/or synchronized with one another. As the peripheral valve 740 is raised, lift rods (similar to lift rods 670) of the lift mechanism may elevated the sealing ring 755 relative to the bottom plate 745, which may also cause the chamber sealing bellow 750 to extend lengthwise. The sealing ring 755 may be raised until an upper surface of the sealing ring 755 contacts an underside of the rim 712 of the choke plate 710, which may prevent the peripheral valve from being raised any further as illustrated in FIG. 7B. In some embodiments, a number of hard stops 765 (similar to hard stops 640) may be coupled with and extend slightly above the upper surface of the sealing ring 755 so as to contact the underside of rim 712. The upper surface of the sealing ring 755 may also include a compressible sealing element 770 that may be compressed between the upper surface of the sealing ring 755 and the lower surface of rim 712 to seal the process volume from the rest of the chamber volume (and slit valve) when the peripheral valve 740 is positioned as shown in FIG. 7B. This may be particularly beneficial in embodiments where multiple chambers share a common chamber volume, as the raised peripheral valve 740 may enable each chamber to have a dedicated processing region that is isolated from other processing regions during processing operations. The isolation of processing regions may improve operating conditions within each chamber and may result in improved wafer quality. The substrate support 725 may continue being raised after the peripheral valve 740 is positioned against the rim 712 of the choke plate 710. For example, the substrate support 725 may be raised to a higher process position proximate the faceplate 720 as shown in FIG. 7C. In such a process position, the substrate support 725 may be higher than the peripheral valve 740.

Figure 8:
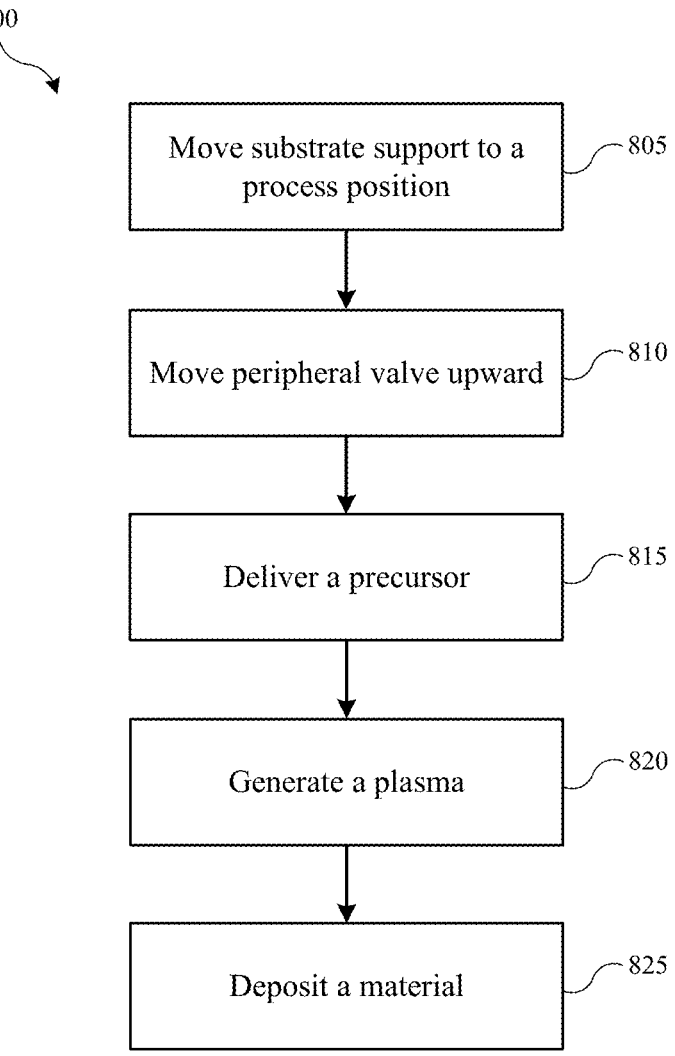
FIG. 8 shows operations of an exemplary method of processing a substrate according to some embodiments of the present technology.

FIG. 8 shows operations of an exemplary method 800 of substrate processing according to some embodiments of the present technology. The method may be performed in a variety of processing chambers, including processing system 100, 200, and 400, and chambers 500 and 700 described above, which may include peripheral valves according to embodiments of the present technology. Method 800 may include a number of optional operations, which may or may not be specifically associated with some embodiments of methods according to the present technology.

Method 800 may include a method that may include optional operations prior to initiation of method 800, or the method may include additional operations. For example, method 800 may include operations performed in different orders than illustrated. In some embodiments, method 800 may include moving a substrate support upward within a semiconductor processing chamber from a transfer position to a process position at operation 805. At operation 810, a peripheral valve (such as peripheral valve 540, 600, and 740) may be moved upward within the semiconductor processing chamber to seal the process region from the rest of the chamber volume (and the slit valve). The substrate support and the peripheral valve may be raised in unison and/or sequentially. In some embodiments, the peripheral valve may be moved upward until a top surface of the peripheral valve contacts a lower surface of a choke plate seated atop a chamber body of the semiconductor processing chamber, which may limit the upward movement of the peripheral valve. In some embodiments, the peripheral valve may include an impact dampening mechanism that helps prevent damage to a lift mechanism when the peripheral valve contacts the choke plate. The peripheral valve may include a self-aligning mechanism that may help align the top surface of the peripheral valve and the lower surface of the choke plate in the event that the contact surfaces of the components are not parallel to one another.

At operation 815, one or more precursors, such as (but not limited to) a silicon-containing precursor, may be delivered to the semiconductor processing chamber. At operation 820, a plasma may be generated of the precursors within the processing region, such as by providing RF power to the faceplate to generate a plasma. Material formed in the plasma may be deposited and/or etched on the substrate at operation 825.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a plate" includes a plurality of such plates, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate processing system, comprising:
a chamber body defining a transfer region;
a lid plate seated on the chamber body, wherein the lid plate defines a plurality of apertures through the lid plate; and
a plurality of lid stacks equal to a number of apertures of the plurality of apertures defined through the lid plate, wherein the plurality of lid stacks at least partially define a plurality of processing regions vertically offset from the transfer region, wherein each of the plurality of lid stacks comprises:
a choke plate seated on the lid plate along a first surface of the choke plate, the choke plate comprising an inner portion that extends inward of an inner surface of the chamber body; and
a pumping liner seated atop the choke plate, the pumping liner defining at least a portion of a gas exhaust path of the chamber body;
a plurality of substrate support assemblies equal to the number of apertures defined through the lid plate, each substrate support assembly of the plurality of substrate support assemblies being disposed in a respective one of the plurality of processing regions, wherein each substrate support assembly of the plurality of substrate support assemblies comprises a support plate and a shaft that is coupled with a bottom of the support plate;
a plurality of peripheral valves equal to the number of apertures defined through the lid plate, each peripheral valve of the plurality of peripheral valves being disposed in a respective one of the plurality of processing regions below a respective one of the plurality of substrate support assemblies, wherein each peripheral valve of the plurality of peripheral valves comprises:
a bottom plate coupled with a lower end of the chamber body, wherein the bottom plate is aligned with a respective one of the plurality of apertures;
a chamber sealing bellow characterized by a first surface and a second surface opposite the first surface, wherein the first surface of the sealing bellow is coupled with a top surface of the bottom plate; and
a sealing ring having a body defining a central aperture that is sized to receive the shaft of a respective one of the plurality of substrate support assemblies, wherein:
an upper surface of the body defines an upper recess having a diameter that is greater than a diameter of the support plate of the respective one of the plurality of substrate support assemblies;
an inner protrusion extending from an inner wall of the body into the central aperture, wherein the second surface of the chamber sealing bellow is fastened to a lower surface of the inner protrusion, and an upper surface of the inner protrusion and the inner wall of the body define the upper recess;
the sealing ring is vertically translatable within the respective one of the plurality of processing regions, wherein in a highest position at least a portion of the sealing ring contacts a surface of the choke plate; and
a compressible sealing element disposed on a top surface of the upper surface, wherein in the highest position, the compressible sealing element is compressed between the surface of the choke plate and the upper surface of the sealing ring.

2. The substrate processing system of claim 1, wherein: each peripheral valve of the plurality of peripheral valves comprises an impact dampening mechanism.

3. The substrate processing system of claim 2, wherein: the impact dampening mechanism comprises a spring.

4. The substrate processing system of claim 1, wherein: the sealing ring comprises at least one hard stop disposed above a top surface of the sealing ring.

5. The substrate processing system of claim 1, wherein: each peripheral valve of the plurality of peripheral valves comprises a lift mechanism disposed beneath the bottom plate.

6. The substrate processing system of claim 1, wherein: a top edge of the sealing ring is vertically aligned with at least a portion of the inner portion of the choke plate.

7. The substrate processing system of claim 1, wherein: each substrate support assembly is vertically translatable within a respective one of the plurality of processing regions; and a raised position of the substrate support assembly is higher than a raised position of a respective one of the plurality of peripheral valves.

8. The substrate processing system of claim 1, wherein: the chamber sealing bellow is extendable and contractible along a vertical axis of the chamber sealing bellow.

9. The substrate processing system of claim 1, wherein the sealing ring, the chamber sealing bellow, and the bottom plate seal a process volume from a chamber volume, when the sealing ring is in the highest position.

10. A substrate processing chamber, comprising:
a chamber body that defines a processing region;
a bottom plate coupled with a lower end of the chamber body, the bottom plate defining a central opening;
a substrate support disposed within the chamber body, the substrate support comprising:
a support plate comprising a heater;
a shaft that is coupled with a bottom of the support plate and that extends through the central opening of the bottom plate;
a peripheral valve disposed in the processing region below the substrate support, wherein the peripheral valve comprises:
a chamber sealing bellow characterized by a first surface and a second surface opposite the first surface, wherein the first surface of the sealing bellow is coupled with a top surface of the bottom plate; and
a sealing ring having a body defining a central aperture that is sized to receive the shaft of the substrate support, wherein:

the sealing ring comprises a plurality of upward protrusions that extend above a top surface of the sealing ring and are configured to serve as hard stops for the sealing ring;
an upper surface of the body defines an upper recess having a diameter that is greater than a diameter of the support plate of the substrate support;
an inner protrusion extending from an inner wall of the body into the central aperture, wherein the second surface of the chamber sealing bellow is fastened to a lower surface of the inner protrusion, and an upper surface of the inner protrusion and the inner wall of the body define the upper recess;
the sealing ring is vertically translatable within the processing region.

11. The substrate processing chamber of claim 10, wherein:
the peripheral valve comprises a plurality of atmospheric sealing bellows that are coupled with a bottom surface of the bottom plate.

12. The substrate processing chamber of claim 10, wherein:
the plurality of upward protrusions each comprise a polymeric material.

13. The substrate processing chamber of claim 10, further comprising:
a choke plate disposed above the chamber body, the choke plate comprising an inner portion that extends inward of an inner surface of the chamber body and downward alongside the inner surface of the chamber body.

14. The substrate processing chamber of claim 13, wherein:
at least a portion of the sealing ring contacts a bottom portion of the inner portion of the choke plate when the peripheral valve is in a raised position.

15. The substrate processing chamber of claim 14, wherein:
the peripheral valve comprises an impact dampening mechanism.

16. The substrate processing chamber of claim 15, wherein:
the impact dampening mechanism comprises a ball stud joint.

* * * * *